United States Patent
Bush et al.

(10) Patent No.: US 9,520,874 B2
(45) Date of Patent: Dec. 13, 2016

(54) OPERATING A STATIC TRANSFER SWITCH TO ELIMINATE TRANSFORMER INRUSH CURRENT IN THE PRESENCE OF RESIDUAL FLUX

(71) Applicant: Liebert Corporation, Columbus, OH (US)

(72) Inventors: Terry D. Bush, Westerville, OH (US); James M. Miller, Fredericktown, OH (US)

(73) Assignee: Liebert Corporation, Columbus, OH (US)

( * ) Notice: Subject to any disclaimer, the term of this patent is extended or adjusted under 35 U.S.C. 154(b) by 472 days.

(21) Appl. No.: 14/056,258

(22) Filed: Oct. 17, 2013

(65) Prior Publication Data
US 2014/0132080 A1    May 15, 2014

Related U.S. Application Data

(60) Provisional application No. 61/724,640, filed on Nov. 9, 2012.

(51) Int. Cl.
    *H01H 47/00*    (2006.01)
    *H03K 17/94*    (2006.01)
    *H02J 9/06*    (2006.01)

(52) U.S. Cl.
    CPC ............ *H03K 17/94* (2013.01); *H02J 9/06* (2013.01); *Y10T 307/747* (2015.04); *Y10T 307/858* (2015.04)

(58) Field of Classification Search
USPC .................................................. 307/113, 130
See application file for complete search history.

(56) References Cited

U.S. PATENT DOCUMENTS

| | | | |
|---|---|---|---|
| 6,701,103 B2 * | 3/2004 | Nakaya | G03G 15/80 307/66 |
| 9,013,157 B2 * | 4/2015 | Vollmar | H02M 5/257 323/258 |
| 2005/0184592 A1 | 8/2005 | Marwali et al. | |
| 2008/0185914 A1 | 8/2008 | Randall | |
| 2010/0052426 A1 | 3/2010 | Carter et al. | |
| 2012/0182662 A1 | 7/2012 | Hsueh | |

FOREIGN PATENT DOCUMENTS

| | | |
|---|---|---|
| WO | WO-2005078893 A1 | 8/2005 |
| WO | WO-2009057979 A2 | 5/2009 |
| WO | WO-2012162457 A2 | 11/2012 |

OTHER PUBLICATIONS

European Search Report for EP 13191714.8 mailed Apr. 30, 2014.

* cited by examiner

*Primary Examiner* — Rexford Barnie
*Assistant Examiner* — Dru Parries
(74) *Attorney, Agent, or Firm* — Harness, Dickey & Pierce, P.L.C.

(57) ABSTRACT

A method is provided for operating a static transfer switch to eliminate transformer inrush current in the presence of residual flux. The method includes: detecting an interrupt of electric power at an output terminal of the static transfer switch; controlling amplitude of voltage at the output terminal using phase fired control of one or more silicon controlled rectifiers interposed between a voltage source and the output terminal, where the amplitude of voltage is set at a value less than a peak value of the sinusoidal waveform; and increasing the amplitude of voltage at the output terminal incrementally until the amplitude reaches a peak value.

16 Claims, 4 Drawing Sheets

OPERATING A STATIC TRANSFER SWITCH TO ELIMINATE TRANSFORMER INRUSH CURRENT IN THE PRESENCE OF RESIDUAL FLUX

CROSS-REFERENCE TO RELATED APPLICATIONS

This application claims the benefit of U.S. Provisional Application No. 61/724,640 filed on Nov. 9, 2012. The entire disclosure of the above application is incorporated herein by reference.

FIELD

The present disclosure relates generally to static transfer switches and, more particularly, to techniques that eliminate transformer inrush current in the presence of residual magnetic flux.

BACKGROUND

When AC current flows through the primary winding of a transformer, an alternating magnetic field is generated which induces magnetic flux in the transformer core. The flux has a varying positive and negative polarity and is normally balanced or centered around zero. The flux in a transformer is directly proportional to the integral of the applied voltage and thus its polarity lags the polarity of the voltage by 90 degrees. The rated design voltage of a transformer also implies a rated level of transformer magnetic flux. If the magnetic flux exceeds the rated levels in either the positive or negative direction, the transformer core begins to become "saturated" with flux. This causes the natural impedance of the primary winding of the transformer to become significantly lower than normal, thereby allowing excess levels of current to flow into the transformer. Such current can be ten to twenty times normal full rated current and can result in severe power distribution problems, such as breaker trips, fuses clear, sources become overloaded, etc. This problem can arise, for example when initially energizing a larger transformer in a random or uncontrolled manner. With reference to FIG. 1, if voltage is applied as indicated at 12 at a random point in the sine wave, the magnetic flux 14 is not necessarily centered around zero and maximum allowable flux levels indicated at 15 can be exceeded as indicated at 16 in FIG. 1.

In the context of a static transfer switch, voltage is typically applied to downstream transformer employing a "soft-start" controlled manner which eliminates or minimizes the inrush current. The soft start control turns on the static switch at the appropriate point in the applied voltage waveform (i.e., at the peak) as indicated at 22 in FIG. 2. Since the magnetic flux is proportional to the integral of the applied voltage and assuming the initial state of the magnetic flux in the transformer core to be zero, it can be mathematically shown that this approach guarantees that the magnetic flux in the transformer core is balanced or centered around zero as shown in FIG. 2.

With reference to FIG. 3, if the voltage applied to a transformer is removed at some point in the waveform at which the flux is non-zero, a residual magnetic flux indicated at 32 will remain in the transformer core for a significant period of time before decaying naturally to zero. Depending on the transformer design, the decay time can extend from several minutes to over an hour. Consequently, if a voltage 12 is re-applied to the transformer soon after the voltage has been remover (e.g., after a brief power failure and subsequent recovery), then the "start-soft" control method, which depends on an initial de-magnetized flux state, cannot guarantee to provide the desired results. Rather, the transformer core may become saturated as indicated at 33. Therefore, it is desirable to develop a new method for operating a static transfer switch will eliminate inrush current in the presence of residual magnetic flux.

This section provides background information related to the present disclosure which is not necessarily prior art.

SUMMARY

This section provides a general summary of the disclosure, and is not a comprehensive disclosure of its full scope or all of its features.

To eliminate inrush current in the presence of residual magnetic flux, one exemplary technique monitors voltage applied to a load terminal of the static transfer switch. Following a voltage interrupt of sufficient duration, a controller in the static transfer switch initiates a startup procedure. During the startup process, the amplitude of the voltage at the load terminal is gradually increased until it reaches the nominal amplitude of the AC input signal. Employing this startup procedure allows re-energizing of a transformer which may be coupled to the load terminal without regard to the period of time elapsed since the power loss.

The static transfer switch may include a first switch arrangement electrically connected between a preferred input terminal and the load terminal, and a second switch arrangement electrically connected between an alternate input terminal and the load terminal, where the preferred input terminal is configured to receive an AC input signal from a preferred voltage source and the alternate input terminal is configured to receive an AC input signal from an alternate voltage source. The first and second switch arrangements are comprised of one or more semiconductor switches.

A controller is interfaced with the semiconductor switches in the first and second switch arrangements. In some embodiments, the semiconductor switches are further defined as silicon-controlled rectifiers. In other embodiments, the first and second switch arrangements are comprised of two silicon-controlled rectifiers arranged in parallel with each other in a back-to-back configuration. The controller monitors the voltage at the load terminal and controls the conductive state of the semiconductor switches to selectively output voltage from either the preferred input terminal or the alternate input terminal to the load terminal. The controller may control the conductive state of the semiconductor switches using phase fired control.

In one aspect, the controller, upon detecting an interruption of voltage at the load terminal, controls the conductive state of the semiconductor switches in a startup mode such that voltage at the load terminal is set at an amplitude substantially less than a peak value of the AC input signal and increases incrementally to the peak value. In some embodiments, the voltage at the load terminal is increased linearly until the amplitude reaches the peak value of the AC input signal.

In another aspect, the controller monitors voltage at the load terminal and controls conductive state of the semiconductor switches to selectively output voltage from either the preferred input terminal or the alternate input terminal to the load terminal, such that the voltage output to the load terminal following an interrupt in the voltage is independent of time elapsed since the interrupt. More specifically, the controller controls the conductive state of the semiconductor switches in a startup mode so that voltage at the load terminal has an amplitude substantially less than a peak value of the AC input signal and increases incrementally to the peak value of the AC input signal. The startup mode may be initiated following an interrupt that exceeds one cycle in the AC voltage signal.

Further areas of applicability will become apparent from the description provided herein. The description and specific examples in this summary are intended for purposes of illustration only and are not intended to limit the scope of the present disclosure.

DRAWINGS

Figure 1:
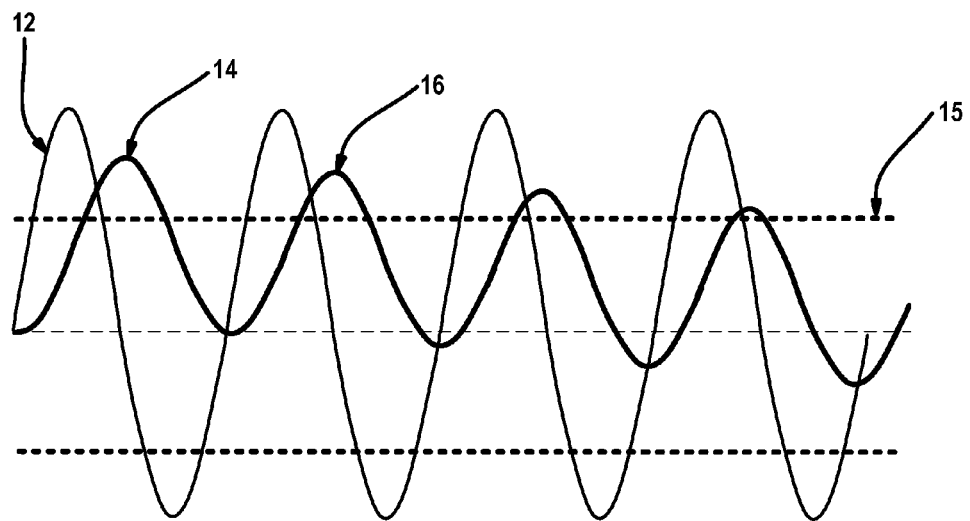
FIG. 1 is a graph illustrating the voltage applied to a primary winding of a transformer in relation to the magnetic flux in the transformer core.
Figure 2:
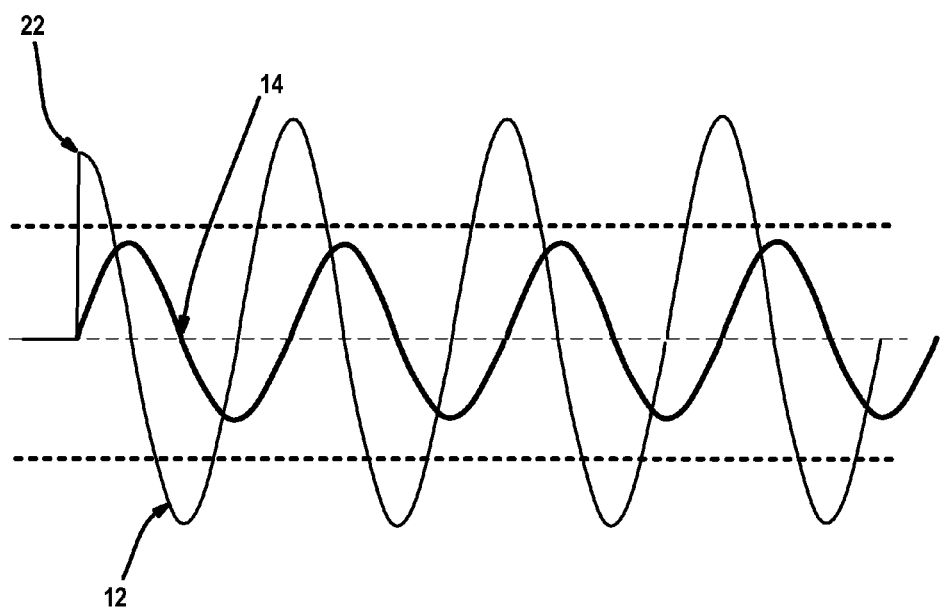
FIG. 2 is a graph illustrating a "soft start" technique for energizing a transformer which avoids flux saturation.
Figure 3:
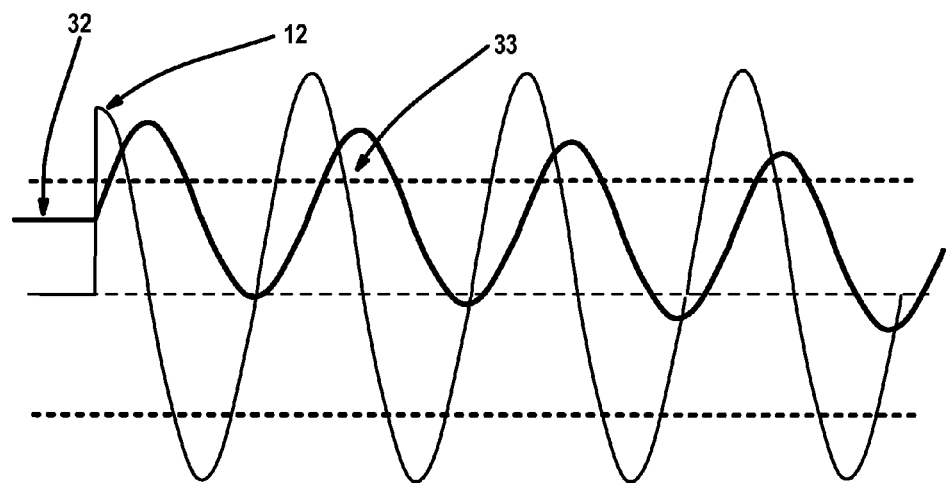
FIG. 3 is a graph illustrating the "soft start" technique for energizing a transformer in the presence of residual magnetic flux.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Figure 4:
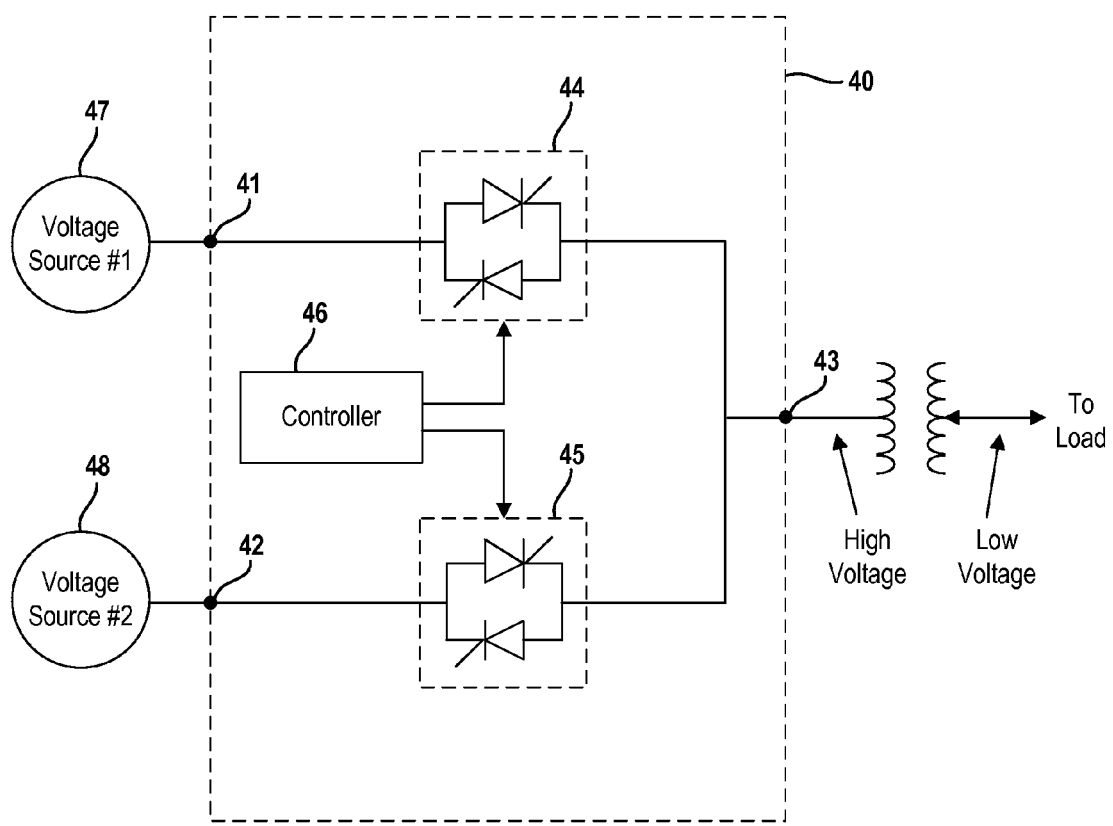
FIG. 4 is a simplified schematic of an exemplary static transfer switch.

FIG. 4 is a simplified schematic of an exemplary static transfer switch 40. The static transfer switch 40 is comprised generally of a preferred input terminal 41, an alternate input terminal 42, a load terminal 43, a first switch arrangement 44, a second switch arrangement 45 and a controller 46. The preferred input terminal 41 is configured to receive electric power from a preferred voltage source 47; whereas, the alternate input terminal 42 is configured to receive electric power from an alternate voltage source 48. In either case, the electric power is received in the form of an AC signal.

The first switch arrangement 44 is electrically connected between the preferred input terminal 41 and the load terminal 43. The first switch arrangement 44 includes one or more semiconductor switches. In an exemplary embodiment, the semiconductor switches are implemented as silicon-controlled rectifiers (SCR). In the context of a single-phase load, the first switch arrangement 44 includes two silicon-controlled rectifiers arranged in parallel with each other in a back-to-back configuration as shown in FIG. 4. It is understood that a similar switch arrangement may be used on each leg in a three phase load application. Moreover, it is understood that other types of thyristors and/or semiconductor switches fall within the scope of this disclosure.

The second switch arrangement 45 is electrically connected between the alternate input terminal 42 and the load terminal 43. The second switch arrangement also include one or more semiconductor switches and may be implemented in a manner similar to the first switch arrangement 44 described above.

The controller 46 is interfaced with the semiconductor switches in the first and second switch arrangements 44, 45. The controller 46 controls the conductive state of the semiconductors switches to selectively couple one of the input terminals 41, 42 to the load terminal 43. In an exemplary embodiment, the controller 46 is implemented as a microcontroller. In other embodiments, controller may refer to, be part of, or include an Application Specific Integrated Circuit (ASIC); an electronic circuit; a combinational logic circuit; a field programmable gate array (FPGA); a microprocessor that executes code; other suitable components that provide the described functionality; or a combination of some or all of the above.

During operation, the controller 46 is configured to monitor operating parameters of the preferred voltage source 47 and the alternate voltage source 48. For example, the load terminal 43 may be receiving power from the preferred voltage source 47. The controller 46 in turn monitors the amplitude and/or frequency of the voltage signal received from the preferred voltage source 47. When either parameter falls outside an acceptable range, the controller 46 may transfer from the preferred voltage source 47 to the alternate voltage source 48. That is, the controller 46 electrically couples the alternate input terminal 42 to the load terminal 43 and uncouples the preferred input terminal 41 from the load terminal 43. To do so, the controller 46 controls the conductive state of the semiconductor switches. Specifically, the semiconductor switches in the first switch arrangement 44 are opened (i.e., non-conductive) and the semiconductor switches in the second switch arrangement 45 are closed (i.e., conductive). Thus, the controller 46 operates to selectively couple one of the preferred voltage source 47 or the alternate voltage source 48 to the load terminal 43 in accordance with the monitored operating parameters.

Some of the primary components and functions of the exemplary static transfer switch 40 are set forth above. It is readily understood that other components may be needed to construct and operate a static transfer switch. For further details regarding an exemplary static transfer switch, reference may be had to the Liebert STS2 static transfer switch commercially available from Emerson Network Power.

In a typical scenario, the load terminal 43 of the static transfer switch 40 may be electrically connected to a winding of a transformer 49. If the voltage applied to the transformer 49 is removed at some point in the waveform at which the flux is non-zero, a residual magnetic flux will remain in the transformer core for a significant period of time before decaying naturally to zero. It is envisioned that the controller 46 may implement a startup procedure or mode that eliminates transformer inrush current in the presence of residual magnetic flux.

During operation, the controller 46 monitors various operating parameters at 52, including the electric power at the load terminal 43. The controller 46 may detect an interrupt in power at the load terminal 43, for example if both the preferred and alternate voltage sources go offline for a sufficient period of time (e.g., exceeding one cycle in the sinusoidal waveform of the AC input signal). It is noted that power interruptions of small durations, such as those occurring during a transfer between the two sources, may be handled in a different manner and do not trigger the startup procedure described below.

Figure 5:
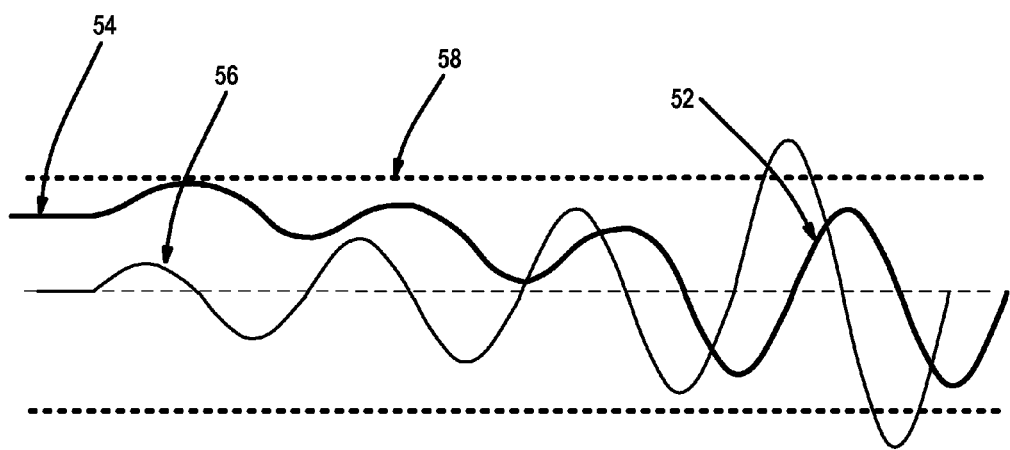
FIG. 5 is a graph illustrating an improved technique for energizing a transformer in the presence of residual magnetic flux.

Following a power interrupt of sufficient duration, the controller 46 will initiate a startup procedure that eliminates inrush current in the presence of any residual magnetic flux. In the startup procedure, the amplitude of voltage at the output terminal 43 is gradually increased, for example over 1 to 2 second interval, until the voltage is at the nominal amplitude value as indicated at 52 of FIG. 5. A change in the magnitude of the magnetic flux in the transformer core is opposed by the reluctance of the core material. This reluctance is analogous to impedance against current flow change in an inductive electrical circuit. Since the applied AC voltage is alternating between positive and negative values, any initial steady state or "DC" level of flux indicated at 54 will be absorbed as losses in the magnetic circuit as a result of the alternating or AC component of the flux superimposed on the DC components. As long as the applied AC voltage starts at a relatively small amplitude as shown at 56, the summation of flux (DC component+AC component) will not exceed the maximum flux 58 allowed before saturation begins. It is noted that that amplitude is set at a value substantially less than a peak value of the nominal sinusoidal waveform and increases incrementally to the peak value. By the time that the AC flux is at normal full amplitude, the residual DC flux will be dissipated to zero and the total flux will be normal. As a result, inrush current will be eliminated independent of any initial residual flux in the transformer. Employing this startup procedure allows re-energizing the transformer without regard to the period of time elapsed since the power loss.

Figure 6:
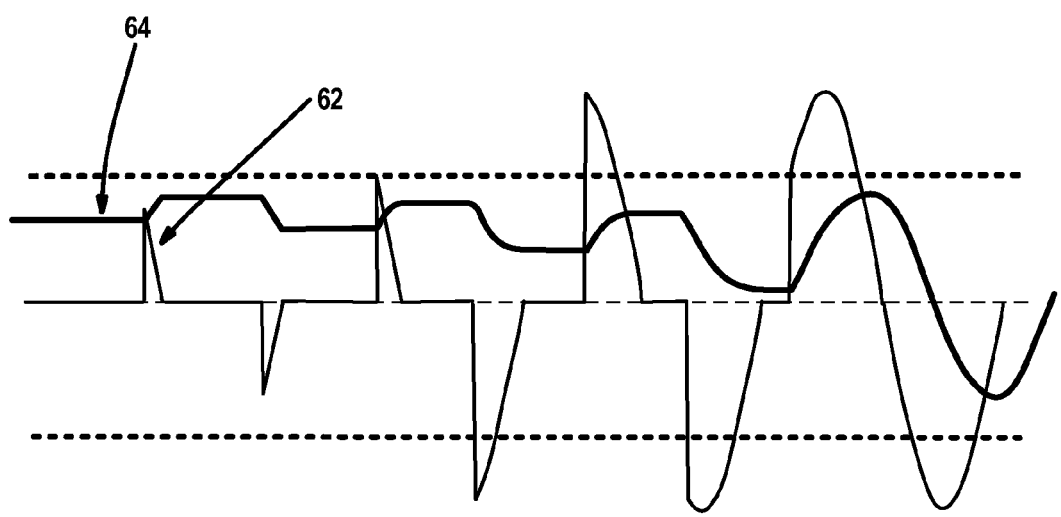
FIG. 6 is a graph illustrating the improved technique for energizing a transformer in the context of the exemplary static transfer switch.

FIG. 6 illustrates implementing the startup procedure in the context of the static transfer switch 40 described above. In the exemplary embodiment, the amplitude of the voltage at the load terminal is controlled by the controller 46 using phase fired control of the silicon-controlled rectifiers. The amplitude of the voltage is initially set to a value that is substantially less than a peak value of the AC input signal as indicated at 62. The amplitude of the voltage is increased incrementally each cycle or half cycle until it reaches the peak value of the AC input signal. During each voltage pulse, the magnetic flux 64 increases and decreases gradually while the waveform moves its center towards zero. For brevity, the voltage amplitude is ramped up to its peak value in only a few cycles (i.e. 4) in FIG. 6 but it is understood that the amplitude is preferably increased more gradually than shown. Other techniques for controlling amplitude of the voltage may be suitable for other types of switches.

Assuming an input signal having a frequency of 60 Hertz, the amplitude of the applied voltage can be increased six degrees each cycle over a one second interval to reach a peak value in 60 cycles. In other words, the phase angle for firing the rectifiers can be determined from the frequency of input signal and a designated time interval for ramping up. In this way, the amplitude increases incrementally and linearly until it reaches its peak value. It is further understood that the voltage may be ramped up over a shorter or longer duration than one second and need not be increased linearly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A static transfer switch, comprising:
a preferred input terminal configured to receive electric power from a preferred voltage source;
an alternate input terminal configured to receive electric power from an alternate voltage source, where the electric power from the preferred voltage source and the alternate voltage source has a sinusoidal waveform;
a load terminal electrically coupled to a transformer;
a first switch arrangement electrically connected between the preferred input terminal and the load terminal, wherein the first switch arrangement includes one or more semiconductor switches;
a second switch arrangement electrically connected between the alternate input terminal and the load terminal, wherein the second switch arrangement includes one or more semiconductor switches; and
a controller configured to monitor operating parameters of at least one of the preferred voltage source and the alternate voltage source, and operates to selectively couple one of the preferred voltage source or the alternate voltage source to the load terminal in accordance with the monitored operating parameters, wherein the controller is interfaced with the semiconductor switches and, upon detecting an interruption of electric power at the load terminal, controls conductive state of the semiconductor switches in a startup mode such that amplitude of the voltage at the load terminal is set to a value substantially less than a peak value of the sinusoidal waveform and increases incrementally to the peak value to thereby remove any residual flux in the transformer and thus maintain magnetic flux in the transformer within an acceptable range, wherein the sinusoidal waveform alternatively applies positive and negative polarity voltages.

2. The static transfer switch of claim 1 wherein the semiconductor switches are further defined as silicon controlled rectifiers.

3. The static transfer switch of claim 1 wherein the first switch arrangement is further defined as two silicon-controller rectifiers arranged in parallel with each other in a back-to-back configuration.

4. The static transfer switch of claim 1 wherein the controller controls the conductive state of the semiconductor switches using phase fired control.

5. The static transfer switch of claim 1 wherein the controller controls the conductive state of the semiconductor switches in the startup mode upon detecting an interrupt of electric power that exceeds one cycle in the sinusoidal waveform.

6. The static transfer switch of claim 1 wherein the controller controls conductive state of the semiconductor switches to increase the voltage at the load terminal linearly until the amplitude reaches the peak value.

7. The static transfer switch of claim 1 wherein the controller controls the conductive state of the semiconductor switches to electrically couple the preferred input terminal to the load terminal and further controls the conductive state of the semiconductor switches to electrically couple the alternate input terminal to the load terminal and uncouple the preferred input terminal to the load terminal when the operating parameters for the preferred voltage source fall outside an acceptable range of operating parameters.

8. A method for operating a static transfer switch electrically coupled to a transformer, comprising:
detecting, by a controller, an interrupt in a voltage applied to at a load terminal of the static transfer switch, where the voltage is selectively supplied from one of two voltage sources having a sinusoidal waveform;

controlling, by the controller, amplitude of the voltage at the load terminal using phase fired control of one or more silicon-controlled rectifiers interposed between each of the voltage sources and the load terminal, where controlling amplitude of the voltage is in response to detecting the interrupt in voltage at the load terminal and the amplitude of voltage, which alternates between positive and negative polarity voltages, is set at a value less than a peak value of the sinusoidal waveform; and increasing the amplitude of voltage at the load terminal incrementally over a given time period until the amplitude reaches a peak value to thereby remove any residual flux in the transformer and thus maintain magnetic flux in the transformer within an acceptable range.

9. The method of claim 8 further comprises monitoring voltage applied to the output terminal and detecting an interrupt in the voltage that exceeds one cycle in the sinusoidal waveform of the voltage.

10. The method of claim 8 wherein controlling amplitude at the output terminal further comprises determining a phase angle for turning on the rectifiers based on frequency of the sinusoidal waveform and the given time period, and turning on the rectifiers at the determined phase angle.

11. The method of claim 8 further comprises increasing the amplitude of voltage at the load terminal linearly until the amplitude reaches the peak value.

12. The method of claim 8 further comprises receiving the voltage applied to the load terminal from a preferred voltage source;

monitoring the voltage in relation to an acceptable range of operating parameters; and selectively coupling the load terminal to an alternate voltage source when the voltage falls outside the acceptable range of operating parameters.

13. A static transfer switch, comprising:

a preferred input terminal configured to receive an AC voltage signal from a preferred voltage source;

an alternate input terminal configured to receive an AC voltage signal from an alternate voltage source;

a load terminal;

a transformer coupled directly to the load terminal;

a first switch arrangement electrically connected between the preferred input terminal and the load terminal, wherein the first switch arrangement includes one or more semiconductor switches;

a second switch arrangement electrically connected between the alternate input terminal and the load terminal, wherein the second switch arrangement includes one or more semiconductor switches; and a controller that monitors voltage at the load terminal and controls conductive state of the semiconductor switches to selectively output voltage from either the preferred input terminal or the alternate input terminal to the load terminal, wherein the controller, upon detecting an interruption of electric power at the load terminal, controls conductive state of the semiconductor switches in a startup mode such that amplitude of the voltage at the load terminal is set to a value substantially less than a peak value of the sinusoidal waveform and increases incrementally to the peak value to thereby remove any residual flux in the transformer and thus maintain magnetic flux in the transformer within an acceptable range, wherein the sinusoidal waveform alternatively applies positive and negative polarity voltages.

14. The static transfer switch of claim 13 wherein the controller controls the conductive state of the semiconductor switches in the startup mode following an interrupt that in that exceeds one cycle in the AC voltage signal.

15. The static transfer switch of claim 14 wherein the semiconductor switches are further defined as silicon controlled rectifiers.

16. The static transfer switch of claim 13 wherein the controller controls the conductive state of the semiconductor switches using phase fired control.

* * * * *